(12) United States Patent
Bleeker

(10) Patent No.: US 7,016,015 B2
(45) Date of Patent: Mar. 21, 2006

(54) LITHOGRAPHIC APPARATUS AND DEVICE MANUFACTURING METHOD

(75) Inventor: Arno Jan Bleeker, Westerhoven (NL)

(73) Assignee: ASML Netherlands B.V, Veldhoven (NL)

( * ) Notice: Subject to any disclaimer, the term of this patent is extended or adjusted under 35 U.S.C. 154(b) by 50 days.

(21) Appl. No.: 10/868,380

(22) Filed: Jun. 16, 2004

(65) Prior Publication Data

US 2005/0018997 A1    Jan. 27, 2005

(30) Foreign Application Priority Data

Jun. 20, 2003    (EP) ................................. 03253902

(51) Int. Cl.
*G03B 27/42* (2006.01)
*G03B 27/72* (2006.01)
*G03B 27/32* (2006.01)
*G03C 5/00* (2006.01)

(52) U.S. Cl. ............................ 355/53; 355/71; 355/77; 430/311

(58) Field of Classification Search .................. 355/53, 355/71; 430/5, 22, 311, 321
See application file for complete search history.

(56) References Cited

U.S. PATENT DOCUMENTS

| 4,869,998 | A | * | 9/1989 | Eccles et al. ................ 430/311 |
| 5,045,419 | A | | 9/1991 | Okumura |
| 5,229,872 | A | | 7/1993 | Mumola |
| 5,296,891 | A | | 3/1994 | Vogt et al. |
| 5,500,736 | A | | 3/1996 | Koitabashi et al. |
| 5,523,193 | A | | 6/1996 | Nelson |
| 5,530,482 | A | | 6/1996 | Gove et al. |
| 5,579,147 | A | | 11/1996 | Mori et al. |
| 5,677,703 | A | | 10/1997 | Bhuva et al. |
| 5,705,299 | A | | 1/1998 | Tew et al. |
| 5,731,131 | A | | 3/1998 | Momma et al. |
| 5,808,797 | A | | 9/1998 | Bloom et al. |
| 5,982,553 | A | | 11/1999 | Bloom et al. |
| 6,133,986 | A | | 10/2000 | Johnson |
| 6,177,980 | B1 | | 1/2001 | Johnson |
| 6,687,041 | B1 | | 2/2004 | Sandstrom |
| 6,747,783 | B1 | | 6/2004 | Sandstrom |
| 6,795,169 | B1 | | 9/2004 | Tanaka et al. |
| 6,806,897 | B1 | | 10/2004 | Kataoka et al. |
| 6,811,953 | B1 | | 11/2004 | Hatada et al. |
| 2004/0041104 | A1 | | 3/2004 | Liebregts et al. |
| 2004/0130561 | A1 | | 7/2004 | Jain |

FOREIGN PATENT DOCUMENTS

| EP | 1 170 635 | 1/2002 |
| EP | 1 482 375 A2 | 12/2004 |
| WO | WO 98/33096 | 7/1998 |
| WO | WO 98/38597 | 9/1998 |

OTHER PUBLICATIONS

Copy of European Search Report for European Appln. 03253902.5 mailed May 19, 2004.
European Search Report for 04253634.2; Dated: Nov. 17, 2004 (4 pages).

* cited by examiner

*Primary Examiner*—Alan Mathews
(74) *Attorney, Agent, or Firm*—Sterne, Kessler, Goldstein & Fox P.L.L.C.

(57) ABSTRACT

A system and method are used to limit a proportion of a programmable patterning means used to pattern a substrate. This is done such that a size of a repeated pattern to be exposed on the substrate is an integer multiple of a size of a pattern exposed on the substrate by the patterned beam.

20 Claims, 4 Drawing Sheets

LITHOGRAPHIC APPARATUS AND DEVICE MANUFACTURING METHOD

BACKGROUND OF THE INVENTION

1. Field of the Invention

This invention is related generally to lithographic systems and their method of use.

2. Related Art

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (resist). Instead of a mask, the patterning means may comprise an array of individually controllable elements that generate the circuit pattern on an impinging light beam.

In general, a single substrate will contain a network of adjacent target portions that are successively exposed. Lithographic apparatus include steppers, in which each target portion is irradiated by exposing an entire pattern onto the target portion in one pass, and scanners, in which each target portion is irradiated by scanning the pattern through the projection beam in a given direction (the "scanning"-direction), while synchronously scanning the substrate parallel or anti-parallel to this direction.

The area on a substrate to be exposed with a given pattern is typically significantly larger than a size of the patterned beam that is incident on the substrate at a given instant. Consequently, the exposure pattern on the substrate is broken down into smaller portions, corresponding to the size of the patterned beam projected onto the substrate. These portions are then successively projected onto the substrate.

The complete pattern to be exposed on the substrate is typically made up of repeating units. This is the case, for example, where a plurality of identical devices are to be formed on the substrate. In this case, the pattern for each device is a repeating unit.

The size of the repeating unit varies, depending on the device being formed. However, the size of the patterned field projected onto the substrate is fixed for each apparatus by the size of the array of individually controllable elements and the magnification of the projection system. Consequently, where the pattern for a first copy of a repeating unit is generated at a given location on the array of individually controllable elements, the same part of the pattern of the repeating unit is generally not generated at the same location for the second and third copies. This means that the data path for controlling the array of individually controllable elements and/or the data storage space required in the apparatus, and hence the cost of the apparatus, is greatly increased.

Therefore, what is needed is to reduce the complexities of providing the data to the array of individually controllable elements, regardless of the variations of the size of the repeating units of pattern to be exposed on the substrate.

SUMMARY OF THE INVENTION

An embodiment of the present invention provides a lithographic apparatus comprising an illumination system for supplying a projection beam of radiation, an array of individually controllable elements serving to impart the projection beam with a pattern in its cross-section, a substrate table for supporting a substrate, a projection system for projecting the patterned beam onto a target portion of the substrate, and a controller for limiting as necessary a proportion of the array of individually controllable elements that is used to generate the patterned beam for at least one of a plurality of sub-exposures that are used to expose a repeating pattern on the substrate, such that a sum of sizes of the sub-exposures, in a given direction, equals the size of the repeating pattern exposed on the substrate, in the direction.

Consequently, the pattern for each portion of the repeating unit is generated at the same location on the array of individually controllable elements for each copy of the repeating unit, simplifying the requirements for supplying the data for setting the array of individually controllable elements. In turn, this significantly reduces the cost of the lithographic apparatus.

The sizes of all of the sub-exposures may reduced equally so that the sub-exposures all have the same size. Consequently, the speed of the substrate relative to the projection system and the pulse rate of the radiation system does not need to vary during the exposure of each repeating unit. Alternatively, however, the controller may be configured to only reduce the size of some of the sub-exposures. For example, only one of the sub-exposures may be reduced in size, effecting all of the adjustment required.

In a further exemplary variation, a first plurality of the sub-exposures may be full-size and a second plurality of the sub-exposures may be a reduced size. Consequently, the average reduction in size of the sub-exposures need not be an integer multiple of the pixel size. The second plurality of sub-exposures may be dispersed within the first plurality of sub-exposures or all of one of the first and second pluralities of sub-exposures may be imaged first, followed by the remainder of the sub-exposures.

The proportion of the array of individually controllable elements that is used may be limited by setting a pattern on one portion of the array of individually controllable elements such that the corresponding portion of the patterned beam contains substantially no radiation.

For instance, when using a programmable mirror array as the array of individually controllable elements, the portion of the array of individually controllable elements not being used may be set to only reflect light that is subsequently filtered out of the reflected beam. Such a system can be simply effected by an addition to the software for controlling the array of individually controllable elements.

Alternatively, and/or additionally, a movable barrier may be provided that can block a given portion of the projection beam and/or the patterned beam. In the former case, the movable barrier prevents radiation from being incident on the array of individually controllable elements and consequently prevents the corresponding part of the patterned beam from being generated. In the latter case, the movable barrier directly prevents the required portion of the patterned beam from being projected onto the substrate. Advantageously, such movable barriers may help prevent stray radiation from reaching the substrate at the locations that correspond to the portion of the array of individually controllable elements that is not used.

A second array of individually controllable elements may also be used. The second array of individually controllable elements may be located in either the path of projection beam or the patterned beam to control which parts of the first array of individually controllable elements are illuminated or which parts of the patterned beam, generated by the first array of individually controllable elements, are projected onto the substrate, respectively. Such a system can be easily reconfigured. The additional array of individually controllable elements may be of a simpler design than the first array of individually controllable elements. For instance, the first array of individually controllable elements may be used to generate grayscales for projection onto the substrate, the further array of individually controllable elements may be a simple binary array of individually controllable elements, each portion of which simply either conveys the radiation or does not. Alternatively, if using a second array of individually controllable elements, one may select a further array of individually controllable elements capable of using grayscales since their combined effect will be to generate many more gray levels.

The controller may also determine which region of the array of individually controllable elements contains faults, for example, non-responsive pixels. The controller can then select the portion of the array of individually controllable elements that is not used in such a way that the total number of faults contained in the portion of the array of individually controllable elements that is used to generate the pattern beam is minimized or that portions of the array of individually controllable elements with less easily correctible faults are not used. The determination of faults in the array of individually controllable elements may be made periodically and stored in a look-up table for use when the controller is limiting the portion of the array of individually controllable elements to be used.

Another embodiment of the present invention provides a device manufacturing method comprising providing a substrate, providing a projection beam of radiation using an illumination system, using an array of individually controllable elements to impart the projection beam with a pattern in its cross-section, projecting the patterned beam of radiation onto a target portion of the substrate, and limiting, as necessary, a proportion of the array of individually controllable elements that is used to generate the patterned beam for at least one of a plurality of sub-exposures that are used to expose a repeating pattern on the substrate such that a sum of sizes of the sub-exposures, in a given direction, equals a size of the repeating pattern exposed on the substrate, in the direction.

According to a further embodiment of the present invention, there is provided a computer program for controlling a lithographic apparatus, comprising code means which when executed on a computer system, cause the apparatus to limit as necessary the proportion of the array of individually controllable elements that is used to generate a patterned beam of radiation for at least one of a plurality of sub-exposures that are used to expose a repeating pattern on a substrate such that the sum of the sizes of the sub-exposures, in a given direction, equals the size of the repeating pattern exposed on the substrate, in the direction.

Further embodiments, features, and advantages of the present invention, as well as the structure and operation of the various embodiments of the present invention are described in detail below with reference to accompanying drawings.

BRIEF DESCRIPTION OF THE FIGURES

The accompanying drawings, which are incorporated herein and form a part of the specification, illustrate various embodiments of the present invention and, together with the description, further serve to explain the principles of the invention and to enable a person skilled in the pertinent art to make and use the invention.

In the Figures, corresponding reference symbols indicate corresponding parts.

DETAILED DESCRIPTION OF THE PREFERRED EMBODIMENTS

Terminology

Figure 1:
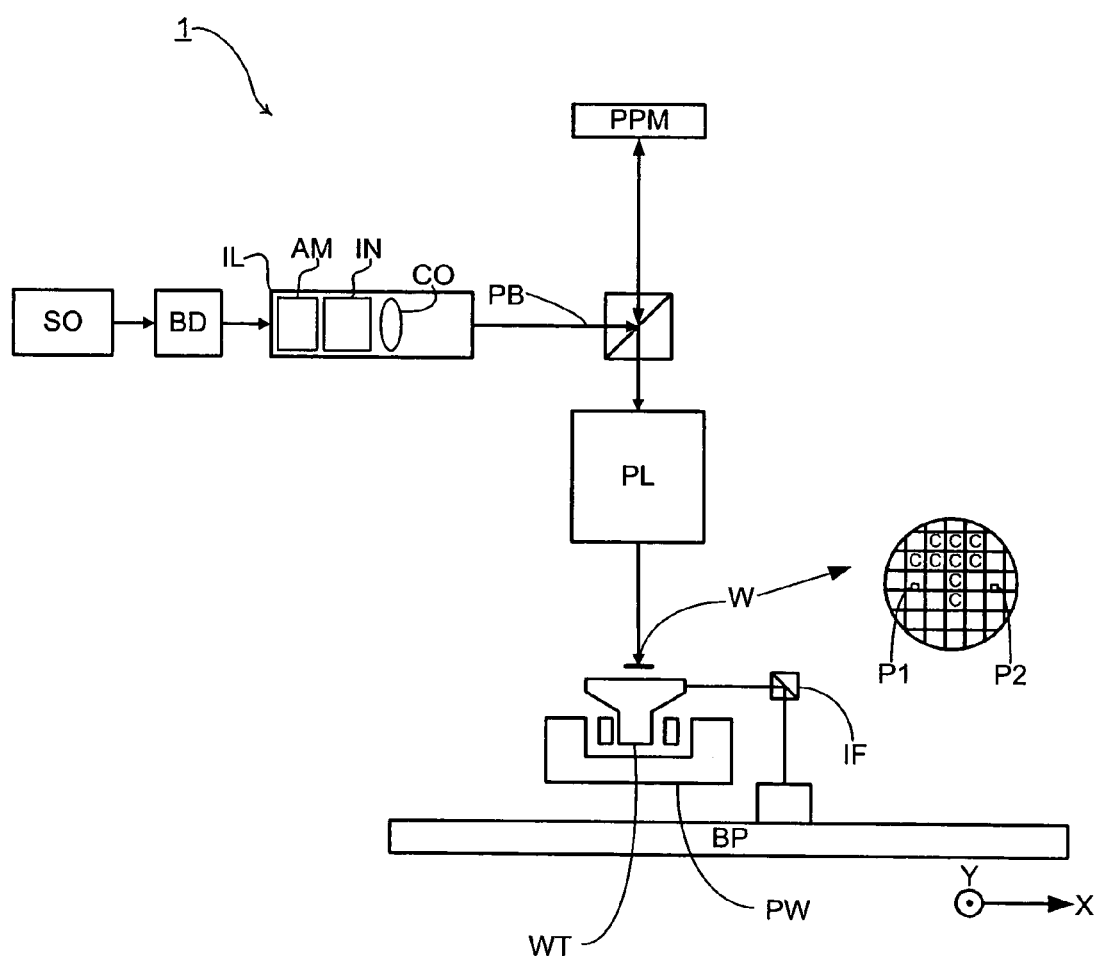
FIG. 1 depicts a lithographic apparatus, according to one embodiment of the invention.

The term "array of individually controllable elements" as here employed should be broadly interpreted as referring to any means that can be used to endow an incoming radiation beam with a patterned cross-section, so that a desired pattern can be created in a target portion of the substrate; the terms "light valve" and "Spatial Light Modulator" (SLM) can also be used in this context. Examples of such patterning means include, but are not limited to, a programmable mirror array and a programmable liquid crystal device (LCD) array.

A programmable mirror array may comprise a matrix-addressable surface having a viscoelastic (i.e., having viscous as well as elastic properties) control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate.

An array of diffractive optical MEMS devices can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors.

The matrix addressing can be performed using suitable electronic means. In the examples described above, the array of individually controllable elements can comprise one or more programmable mirror arrays. More information on mirror arrays can be found, for example, from U.S. Pat. Nos. 5,296,891 and 5,523,193, and PCT patent applications WO 98/38597 and WO 98/33096, which are incorporated herein by reference.

An example programmable LCD array is shown in U.S. Pat. No. 5,229,872, which is incorporated herein by reference.

It should be appreciated that where pre-biasing of features, optical proximity correction features, phase variation techniques, and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures, during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including, but not necessarily limited to, ultraviolet (UV) radiation (e.g. having a wavelength of 408, 355, 365, 248, 193, 157 or 126 nm) and extreme ultra-violet (EUV) radiation (e.g. having a wavelength in the range of 5–20 $\mu$m), as well as particle beams, such as ion beams or electron beams.

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the array of individually controllable elements and the first element of the projection system. Immersion techniques are well known in the art for increasing the numerical aperture of projection systems.

Exemplary Environment

FIG. 1 schematically depicts a lithographic projection apparatus, according to one embodiment of the invention. The apparatus comprises an illumination system (illuminator) IL, an array of individually controllable elements PPM, a substrate table WT for supporting a substrate W, and a projection system ("lens") PL.

Illumination system (illuminator) IL provides a projection beam PB of radiation (e.g. UV radiation).

The array of individually controllable elements PPM (e.g., a programmable mirror array) patterns the projection beam. In one example, the position of the array of individually controllable elements will be fixed relative to projection system PL. In another example, it may instead be connected to a positioning means for accurately positioning it with respect to projection system PL.

As discussed above, the substrate table WT (e.g., a wafer table) supports the substrate W (e.g. a resist-coated wafer). The substrate table WT is also connected to a positioning means PW for accurately positioning the substrate with respect to projection system PL.

The projection system ("lens") PL images a pattern imparted to the projection beam PB by the array of individually controllable elements PPM onto a target portion C (e.g., comprising one or more dies) of the substrate W. In one example, the projection system PL may image the array of individually controllable elements PPM onto the substrate W. In anther example, the projection system PL may image secondary sources, for which the elements of the array of individually controllable elements PPM act as shutters. The projection system PL may also comprise an array of focusing elements, such as a micro lens array (known as an MLA) or a Fresnel lens array. This can be done, for example, to form the secondary sources and to image microspots onto the substrate.

In the embodiment shown, the apparatus is of a reflective type (i.e., has a reflective array of individually controllable elements). However, in general, it may also be of a transmissive type, e.g., with a transmissive array of individually controllable elements.

The illuminator IL receives a beam of radiation from a radiation source SO. In one example, the source SO and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD.

In this case the beam delivery system BD includes, but is not limited to, suitable directing mirrors and/or a beam expander. In other examples the source SO may be integral part of the apparatus, for example when the source is a mercury lamp. In this example, the source SO and the illuminator IL, together with the beam delivery system BD, if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator IL can be adjusted. In some examples the illuminator IL comprises various other components, such as an integrator IN and a condenser CO. The illuminator IL provides a conditioned beam of radiation, referred to as the projection beam PB, having a desired uniformity and intensity distribution in its cross-section.

The beam PB subsequently interacts with the array of individually controllable elements PPM. Having been reflected by the array of individually controllable elements PPM, the beam PB passes through the projection system PL, which focuses the beam PB onto a target portion C of the substrate W.

In one example, with the aid of a positioning means PW, and possibly an interferometric measuring means IF, the substrate table WT can be moved accurately, e.g., so as to position different target portions C in the path of the beam PB.

In one example, a positioning means PW for the array of individually controllable elements PPM can be used to accurately correct the position of the array of individually controllable elements PPM with respect to the path of the beam PB, e.g. during a scan.

In one example, movement of the substrate table WT is realized with the aid of a long-stroke module (course positioning) and a short-stroke module (fine positioning), which are not explicitly depicted in FIG. 1. A similar system may also be used to position the array of individually controllable elements PPM.

It will be appreciated that the projection beam PB may alternatively/additionally be moveable while the substrate table WT and/or the array of individually controllable elements PPM may have a fixed position to provide the required relative movement.

As a further alternative, that may be especially applicable in the manufacture of flat panel displays, the position of the substrate table WT and the projection system PL may be fixed and the substrate W may be arranged to be moved relative to the substrate table WT. For example, the substrate table WT may be provided with a system for scanning the substrate W across it at a substantially constant velocity.

Although the lithography apparatus according to the invention is herein described as being for exposing a resist on a substrate, it will be appreciated that the invention is not limited to this use and the apparatus may be used to project a patterned projection beam for use in resistless lithography.

The depicted apparatus can be used in four preferred modes: a step mode, a scan mode, a pulse mode, and a continuous scan mode.

In a step mode, the array of individually controllable elements PPM imparts an entire pattern to the projection beam PB, which is projected onto a target portion C in one pass (i.e., a single static exposure). The substrate table WT is then shifted in the X and/or Y direction, so that a different target portion C can be exposed. In step mode, the maximum size of the exposure field limits the size of the target portion C imaged in a single static exposure.

In Scan mode, the array of individually controllable elements PPM is movable in a given direction (e.g., a "scan direction" or a Y direction) with a speed v, so that the projection beam PB is caused to scan over the array of individually controllable elements PPM. Concurrently, the substrate table WT is substantially simultaneously moved in the same or opposite direction at a speed V=Mv, in which M is the magnification of the lens PL. In scan mode, the maximum size of the exposure field limits the width (in the non-scanning direction) of the target portion C in a single dynamic exposure, whereas the length of the scanning motion determines the height (in the scanning direction) of the target portion C.

In Pulse mode, the array of individually controllable elements PPM is kept essentially stationary and the entire pattern is projected onto a target portion C of the substrate W using a pulsed radiation system. The substrate table WT is moved with an essentially constant speed, such that the projection beam PB is caused to scan a line across the substrate W. The pattern on the array of individually controllable elements PPM is updated as required between pulses of the radiation system. The pulses are timed such that successive target portions C are exposed at the required locations on the substrate W. Consequently, the projection beam PB scans across the substrate W to expose the complete pattern for a strip of the substrate W. The process is repeated until the complete substrate W has been exposed line by line.

Continuous scan mode is essentially the same as pulse mode except that a substantially constant radiation source is used and the pattern on the array of individually controllable elements PM is updated as the projection beam PB scans across the substrate W and exposes it.

Combinations and/or variations on the above described modes of use or entirely different modes of use may also be employed.

Exemplary Projection Optical Systems

Figure 2:
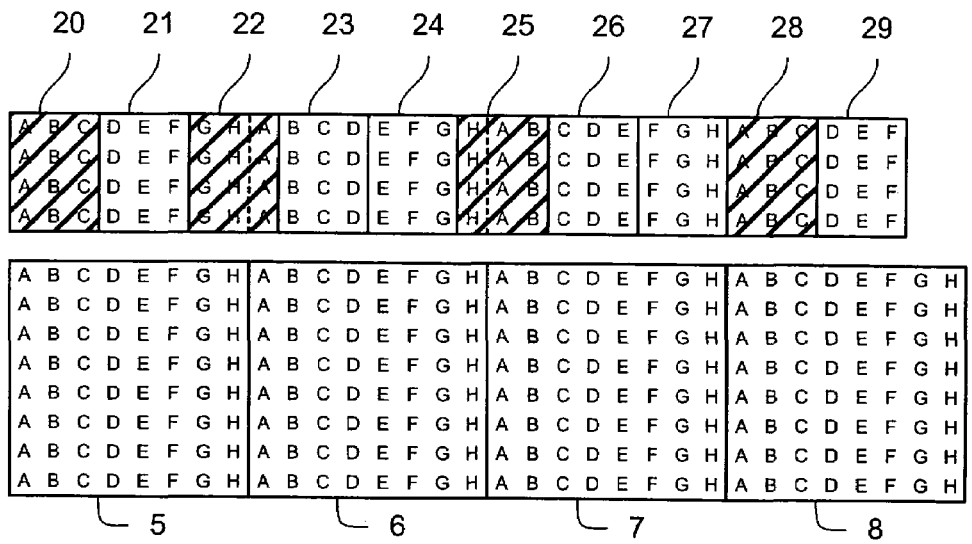
FIG. 2 depicts a pattern to be projected onto a sequence of repeated units and corresponding patterns that must be generated in sequence on an array of individually controllable elements, according to one embodiment of the present invention.

FIG. 2 depicts a pattern to be projected onto a sequence of repeated units and corresponding patterns generated in sequence on an array of individually controllable elements, according to one embodiment of the present invention.

Figure 3:
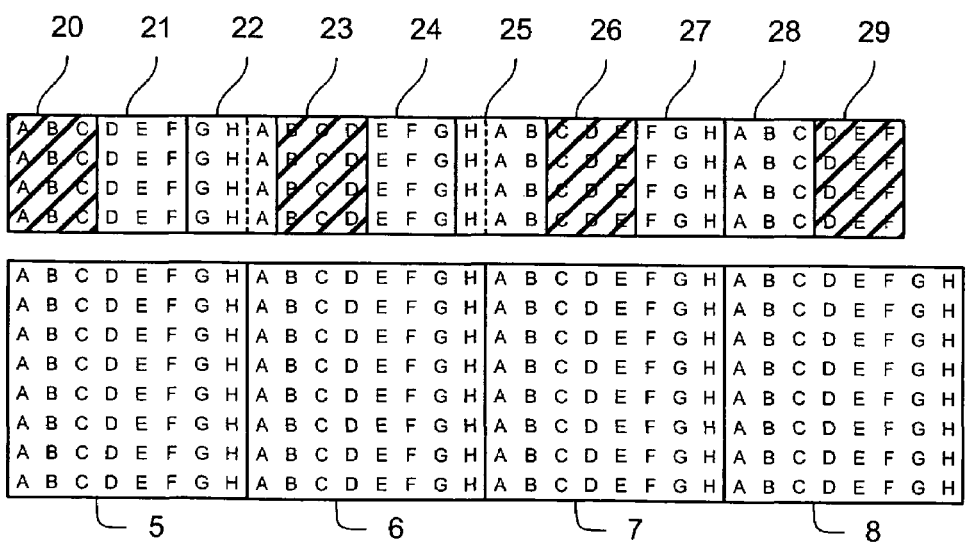
FIG. 3 depicts a variant of the scheme shown in FIG. 2, according to one embodiment of the present invention.

FIG. 3 depicts a variant of the scheme shown in FIG. 2, according to one embodiment of the present invention.

FIGS. 2 and 3 show repeating units of pattern 5, 6, 7, 8 are to be produced on a substrate (not shown). The pattern is broken down into portions 20 to 29 that are a same size as a patterned field generated by an array of individually controllable elements (not shown) when projected onto the substrate. As shown, the size of the repeating pattern to be produced is not an integer multiple of the size of the field generated by the array of individually controllable elements. Consequently, the start of each repeating unit of pattern does not coincide with the start of a section generated by a single an array of individually controllable elements.

For example, the copies of the repeating unit denoted 6 and 7 start partway through the array of individually controllable elements patterns denoted 22 and 25. Although in the example shown the pattern returns to the start at the beginning of the fourth copy 8 of the repeating unit of the pattern produced on the substrate, the sequence shown is simplified and, in general, it will take many more copies of the repeating unit for this to happen and will often require more copies of the repeated unit than are present on the substrate.

With reference to FIG. 2, the effect of the mismatch between the size of the repeating unit of the pattern 20, 22, 25, 28 on the substrate and the size of the image field projected onto the substrate by the array of individually controllable elements is shown. If one array of individually controllable elements is to be used to provide the pattern for the start of each repeating unit, then the pattern on that array of individually controllable elements must be different each time. For clarity, in FIG. 2 the pattern for the array of individually controllable elements for the start of each repeating unit has been shaded.

Turning now to FIG. 3, a different strategy is used. This time, each array of individually controllable elements is used to provide every third piece of pattern. One array of individually controllable elements, for example, provides patterns 20, 23, 26 and 29, which are shaded in FIG. 3. Again, the pattern that must be provided on the array of individually controllable elements changes from exposure to exposure.

Regardless of whether the system of FIG. 2 or the system of FIG. 3 is used, there are many different configurations of the pattern that have to be formed on the array of individually controllable elements. Consequently, more data storage or a more complex data path is required to provide the pattern to the array of individually controllable elements.

Figure 4:
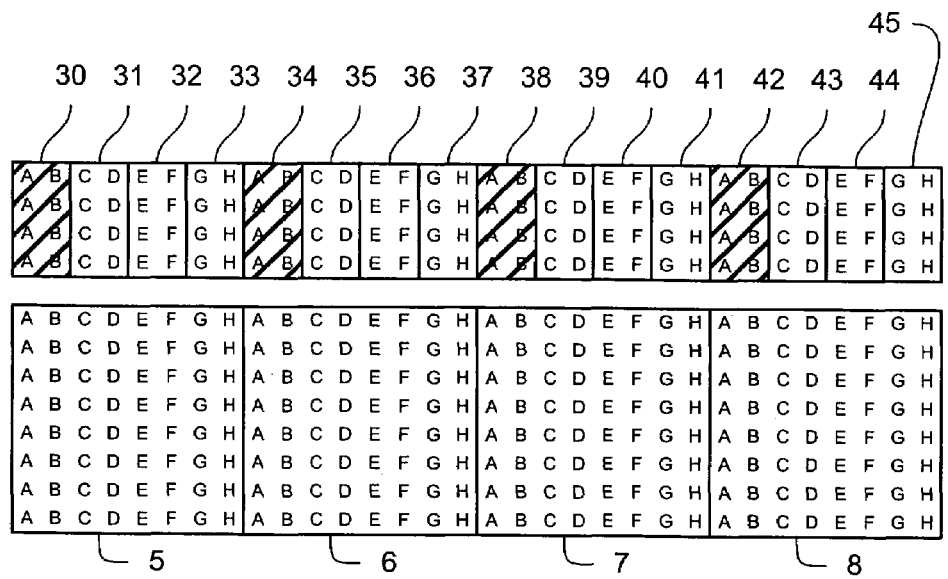
FIG. 4 depicts another scheme, according to one embodiment of the present invention.

FIG. 4 depicts another scheme, according to one embodiment of the present invention. In this embodiment, the extent of the array of individually controllable elements used is reduced, such that the size of the repeating unit 5, 6, 7, 8 of the pattern to be produced is an integer multiple of the size of the pattern 30 to 45 produced by the array of individually controllable elements. Consequently, the start of each repeating unit 5, 6, 7, 8 of the pattern to be produced on the substrate coincides with the patterns 30, 44, 38, 42 (shaded) generated by the array of individually controllable elements. Consequently, in the example shown in FIG. 4, only four sets of pattern data for the array of individually controllable elements are required: (1) a first portion of data for patterns 30, 44, 38, 42; (2) a second portion of data for patterns 31, 35, 39, 43; (3) a third portion of data for patterns 32, 36, 40, 44; and (4) a fourth portion of data for patterns 33, 37, 41, 45.

It is to be appreciated that as well as reducing the size of the fields generated by the array of individually controllable elements on the substrate, the size of the step between each exposure must be correspondingly reduced. This may be achieved, for example, by adjusting the speed at which the substrate is moved or by adjusting the frequency of the pulses of the radiation system.

Therefore, if a single array of individually controllable elements is to be used to provide the pattern for exposing a complete strip of the substrate, each of the sets of pattern data can be stored in a simple buffer for retrieval at the appropriate point during each repeating unit of pattern.

Figure 5A:
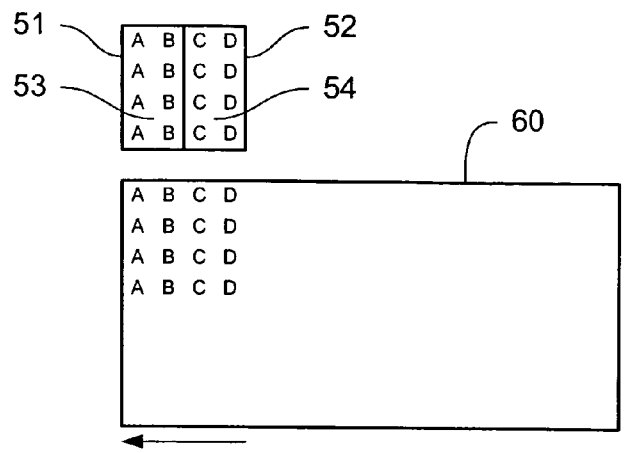
FIGS. 5a, 5b and 5c depict an exposure sequence for a substrate, according to one embodiment of the present invention.
Figure 5B:
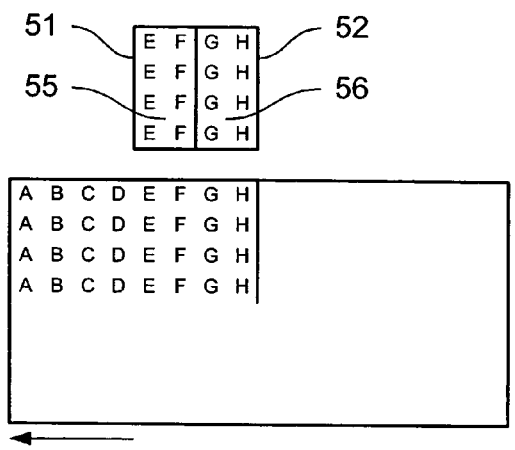
Figure 5C:
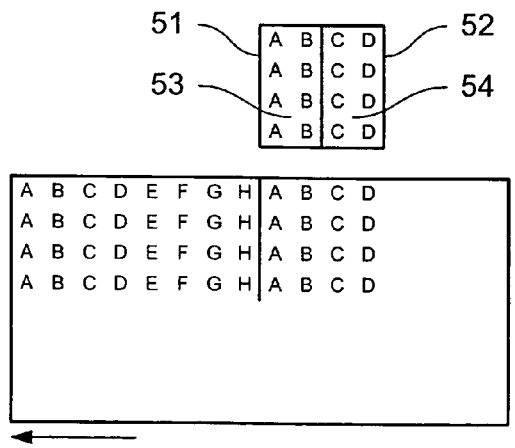

FIGS. 5a, 5b and 5c depict an exposure sequence for a substrate, according to one embodiment of the present invention. In an alternative embodiment to that shown in FIG. 4, two or more arrays of individually controllable elements can be used in conjunction to expose a single strip of the substrate. For example if, in the example shown in FIG. 4, two arrays of individually controllable elements are used, each can provide the pattern according to two of the pattern sets as shown in FIGS. 5a, 5b and 5c. As shown in sequence in FIGS. 5a, 5b and 5c, a substrate 60 scans beneath two arrays of individually controllable elements 51, 52 and the pattern is sequentially exposed on substrate 60. First array of individually controllable elements 51 provides first 53 and third 55 pattern sets, namely "AB" and "EF," and second array of individually controllable elements 52 provides second 54 and fourth 56 pattern sets, namely "CD" and "GH."

As shown in FIG. 5a, first array of individually controllable elements 51 is initially set to provide first pattern set 53, while data to provide third pattern set 55 is stored in a data buffer. Similarly, the second array of individually controllable elements is set to provide second pattern set 54, while data to provide fourth pattern set 56 is stored in a data buffer. First and second pattern sets 53, 54 are then exposed on the substrate.

In the next stage, as shown in FIG. 5b, substrate 60 is moved relative to arrays of individually controllable elements 51, 52 by an amount corresponding to the size of the pattern exposed on substrate 60 by the array of individually controllable elements in each exposure. The pattern on first array of individually controllable elements 51 is then re-set to be third pattern set 55, using the data in the data buffer and the data for forming the first pattern set 53 is transferred to the buffer. Likewise the pattern on the second array of individually controllable elements is changed to the fourth pattern set 56 and the data for forming the second pattern set 54 is transferred to the buffer. The third and fourth pattern sets 55, 56 are then exposed on the substrate. Subsequently, the process is repeated (the substrate is moved on another step; the data used to set the array of individually controllable elements 51, 52 is exchanged with that in the buffer; and the pattern on the array of individually controllable elements is exposed on the substrate) until the pattern has been repeated across the substrate.

It will be appreciated that each array of individually controllable elements may provide the pattern according to more than two pattern sets and that, when not being used to provide the pattern for a array of individually controllable elements, the data for the pattern sets may be stored otherwise than in a data buffer. Similarly, any number of array of individually controllable elements may be used together to expose a strip of the substrate and each portion of the substrate maybe exposed more than once as the substrate is moved past the array of individually controllable elements.

The reduction in throughput as a result of reducing the extent of the array of individually controllable elements used in each exposure is expected to be minimal. For example, if a device to be formed on a substrate is of the order of 20 mm long and the size of an individual array of individually controllable elements is 40 $\mu$m (e.g., 1000 pixels of 40 nm size), then the pattern must be split into 500 portions to each be formed by the array of individually controllable elements.

In one example, the size of the device to be formed on the substrate would be 20 mm less an amount fractionally under 40 $\mu$m (e.g., the size of a whole array of individually controllable elements), namely 19960 $\mu$m. In this example, the portion of the array of individually controllable elements used would be limited to 19960/500=39.92 $\mu$m. This means that the array of individually controllable elements would be limited by 80 nm, i.e., two pixels. In turn, this means that the throughput would be reduced by 0.2% which is acceptable.

The control of the extent of the array of individually controllable elements used to form the pattern image on the substrate may be effected by, for instance, a controller. In order to limit the effective size of the array of individually controllable elements, the controller may set a portion of the array of individually controllable elements such that no radiation from this portion reaches the substrate. For instance, if the array of individually controllable elements is transmissive, this portion of the array of individually controllable elements will be set to be opaque. Alternatively, if, for example, the array of individually controllable elements is an array of micromirrors, the mirrors of this portion are positioned such that the radiation does not enter the projection system.

The controller may additionally/alternatively control one or more moveable barriers. These may be located between the radiation system and the array of individually controllable elements and/or between the array of individually controllable elements and the substrate. The former can be used to prevent a portion of the array of individually controllable elements from being illuminated while the latter prevents a portion of the patterned beam emitted from the patterning means from exposing a corresponding portion of the substrate.

A further additional or alternative means by which the controller may limit the portion of the array of individually controllable elements that provides a pattern to expose the substrate is the provision of a further array of individually controllable elements between the radiation system and the first array of individually controllable elements and/or between the first array of individually controllable elements and the substrate. As with the movable barrier, the former is used to prevent a portion of the first array of individually controllable elements from being illuminated while the latter is used to prevent a portion of the patterned beam emitted from the first array of individually controllable elements from exposing the substrate.

The further array of individually controllable elements may be simply binary, namely each pixel either substantially completely blocking radiation or not reducing its intensity at all. Alternatively, the further array of individually controllable elements may be able to generate grayscales as well as the first array of individually controllable elements, such that when used in conjunction, the first array of individually controllable elements and the further array of individually controllable elements can generate a greater number of grayscales.

The array of individually controllable elements may be periodically tested to identify any faults, such as non-responsive pixels. In this case, the controller may select the portion of the array of individually controllable elements not used for exposing the substrate in a manner such that the faults in the portion of the array of individually controllable elements that is used are minimized.

Figure 6:
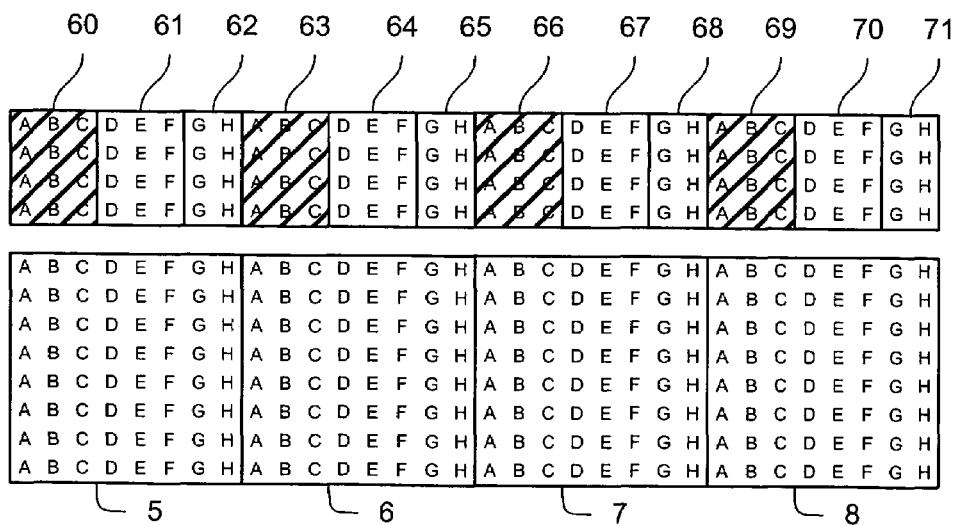
FIG. 6 depicts a variant of the scheme shown in FIG. 4, according to one embodiment of the present invention.

FIG. 6 shows a variation of the embodiment of the invention shown in FIG. 4, according to one embodiment of the present invention. In this case, the extent of the array of individually controllable elements used for each exposure that makes up a single repeating unit 5,6,7,8 is not reduced such that the size of the repeating unit 5,6,7,8 of the pattern to be produced is an integer multiple of the size of the pattern produced by the array of individually controllable elements. Instead, all but one of the exposures 60,61,63,64,66,67,69, 70 that make up each repeating unit 5,6,7,8 use the full extent of the array of individually controllable elements. The extent of the array of individually controllable elements used for the last exposure 62,65,68,71 is reduced such that the sum of the sizes of all exposures for each repeating unit is the same size as the repeating unit. Consequently, as before, the same sets of array of individually controllable elements data are required to produce all of the repeating units of the pattern. It will be appreciated that it need not be the last exposure that is reduced in size and that more than one exposure may be reduced.

In general, the invention may be effected by reducing the size of each of the exposures required to produce a repeating unit by different amounts provided that the sum of the sizes of all the exposures for the repeating unit is the same as the size for the repeating unit. However, where the size of adjacent exposures varies, the speed of the substrate relative to the projection system and/or the pulse rate of the radiation system must also vary during the exposure of each repeating unit of the pattern in order to ensure that the edges of the exposures are aligned as required. For example, the adjacent exposures may abut each other or there may be some overlap at the edges of the adjacent exposures to ensure continuity of the exposed pattern (i.e., this is commonly referred to as "stitching").

It maybe especially beneficial to reduce the size of some of the exposures in a repeating unit but not reduce the size of others. For example, if the average size reduction for the exposures making up a repeating unit is not an integer multiple of the pixel size, it is beneficial to reduce the size of different exposures by different amounts such that each can be reduced by an integer number of pixels. As discussed above, the position of each of the exposures must be adjusted to take account of the reduced size of each exposure. This may be effected by changing the speed of the substrate relative to the projection system and/or by adjusting the pulse rate of the radiation system. If the size reduction of the exposures is by an integer multiple of the pixel size, then the corresponding position adjustment of the exposures will also be by integer multiples of the pixel size. Limiting the positional adjustments to integer multiples of the pixel size reduces the complexity of the control system.

Furthermore, the exposure of a complete pattern on the substrate may be effected by two or more exposures on each part of the substrate. In this case, it is typically desirable to offset the position of the subsequent exposures by a fraction of a pixel size. For example, if two exposures are used for each part of the substrate, the second exposure is offset from the first exposure by half a pixel. Such a system makes it possible to produce smaller pattern features because the two halves of a spot on the substrate exposed by a single pixel in the first exposure are exposed by different pixels in the second exposure and can therefore receive different total doses of radiation (by setting the two pixels in the second exposure to different values). This may be used to adjust the position of the edge of a pattern feature, for example. If the adjustments of the positions of the exposures within a repeating unit are only moved by integer multiples of the pixel size, it remains possible to arrange subsequent exposures on a given portion of the substrate that are offset by a fraction of the size of a pixel relative to the first exposures.

In general, therefore, a first group of the exposures within a repeating unit of the pattern to be exposed on the substrate are reduced by a first integer multiple number of pixels and a second group of exposures are reduced by a second integer multiple number of pixels (additional groups with further alternative size reductions may also be used). For example, in the situation in which the average required size reduction for the exposures within a repeating unit is half the size of a pixel, half of the exposures are not reduced in size and half are reduced by one pixel. Correspondingly, the position of half of the exposures must be moved by the size of one pixel. This may be most simply effected by adjusting the timing of the illumination system. For example, if the pixel size is 30 nm and the speed of the substrate is being scanned relative to the projection system is 240 nm/s, the required adjustment of the timing of the illumination system is 125 ns. In such a situation, the unaltered time between exposures will be of the order of 250 $\mu$s. An adjustment of this size will not effect the performance of the illumination system.

Accordingly, the reduced-size exposures may be arranged in any convenient fashion. For example, the reduced-size exposures may alternate with the full-size exposures or the exposures may be arranged such that all of the full-size exposures are exposed on the substrate first and then all of the reduced-size exposures are exposed on the substrate. In this case, the repetition rate of the illumination system need only be changed once. It will be clear that any other convenient arrangement of the exposures may also be used. Such an arrangement of the reduced-size exposures can also be used with other arrangements for adjusting the position of the exposures, such as by adjusting the movement of the substrate relative to the projection system.

CONCLUSION

While specific embodiments of the invention have been described above, it will be appreciated that the invention may be practiced otherwise than as described. The description is not intended to limit the invention.

What is claimed is:

1. A lithographic apparatus, comprising:
    an illumination system that supplies a projection beam of radiation;
    an array of individually controllable elements that pattern the projection beam;
    a projection system that projects the patterned beam onto a target proportion of a substrate; and
    a controller that limits a proportion of the array of individually controllable elements that is used to generate the patterned beam for at least one of a plurality of sub-exposures that are used to expose a repeating pattern on the substrate, such that a sum of sizes of said sub-exposures, in a given direction, equals a size of the repeating pattern exposed on the substrate, in said direction.

2. The lithographic projection apparatus of claim 1, wherein said controller:
    limits the proportion of the array of individually controllable elements that is used to generate the patterned beam for a first plurality of the sub-exposures used to expose said repeating pattern; and
    does not limit the proportion of the array of individually controllable elements used to generate the patterned beam for a second plurality of the sub-exposures used to expose said repeating pattern.

3. The lithographic projection apparatus of claim 2, wherein all of one of said first and second plurality of sub-exposures are exposed on the substrate consecutively before the remainder of the sub-exposures are exposed.

4. The lithographic projection apparatus of claim 2, wherein said first plurality of sub-exposures are interspersed among the remainder of the sub-exposures.

5. The lithographic projection apparatus of claim 1, wherein said controller limits the proportion of the array of individually controllable elements that is used to generate the patterned beam for all of the sub-exposures used to expose said repeating pattern, such that the sizes of said sub-exposures, in said direction, are the same.

6. The lithographic projection apparatus of claim 1, wherein said controller limits the proportion of the array of individually controllable elements that is used to generate the patterned beam for only one of the sub-exposures used to expose said repeating pattern.

7. The lithographic projection apparatus of claim 1, wherein the controller limits the proportion of the array of individually controllable elements used by setting a pattern on a proportion of the array of individually controllable elements, such that there is substantially no radiation in the corresponding proportion of the patterned beam.

8. The lithographic projection apparatus of claim 1, wherein the controller comprises:
    a movable barrier for substantially preventing a proportion of the patterned beam from being projected onto the substrate.

9. The lithographic projection apparatus of claim 1, wherein the controller comprises:
    a movable barrier for substantially preventing a controlled proportion of the projection beam from being incident on and patterned by the array of individually controllable elements.

10. The lithographic projection apparatus of claim 1, wherein the controller comprises:
    a further array of individually controllable elements for controlling which parts of the projection beam are incident on and patterned by the array of individually controllable elements.

11. The lithographic projection apparatus of claim 10, wherein said array of individually controllable elements and said further array of individually controllable elements can each generate three or more gray levels.

12. The lithographic projection apparatus of claim 1, wherein the controller comprises:
    a further array of individually controllable elements that control which parts of the patterned beam are projected onto the substrate.

13. The lithographic projection apparatus of claim 11, wherein said array of individually controllable elements and said further array of individually controllable elements can each generate three or more gray levels.

14. The lithographic projection apparatus of claim 1, wherein said controller comprises:
    a device that identifies regions of the array of individually controllable elements having faults,
    wherein when the controller is limiting the proportion of the array of individually controllable elements used, the controller minimizes the number of faults in the proportion of the array of individually controllable elements that is used.

15. A device manufacturing method, comprising:
    patterning a projection beam using an array of individually controllable elements;
    projecting the patterned projection beam at a target proportion of a substrate; and
    limiting a proportion of the array of individually controllable elements that is used to generate the patterned projection beam for at least one of a plurality of sub-exposures that are used to expose a repeating pattern on the substrate.

16. The method of claim 15, wherein a sum of sizes of said sub-exposures, in a given direction, equals a size of the repeating pattern exposed on the substrate, in said direction.

17. The method of claim 15, wherein a size of the repeated pattern to be exposed on the substrate is an integer multiple of a size of a pattern exposed on the substrate by the patterned beam.

18. A computer program product for controlling a lithographic apparatus comprising a computer useable medium having a computer program logic recorded thereon for controlling at least one processor, the computer program logic comprising:
    computer program code means for patterning a projection beam using an array of individually controllable elements;
    computer program code means for projecting the patterned projection beam at a target proportion of a substrate; and
    computer program code means for causing the lithographic apparatus to limit a proportion of the array of individually controllable elements that is used to generate a patterned beam of radiation for at least one of a plurality of sub-exposures that are used to expose a repeating pattern on a substrate.

19. The computer program product of claim 18, wherein a sum of sizes of said sub-exposures, in a given direction, equals a size of the repeating pattern exposed on the substrate, in said direction.

20. The computer program product of claim 18, wherein a size of the repeated pattern to be exposed on the substrate is an integer multiple of a size of a pattern exposed on the substrate by the patterned beam.

* * * * *